United States Patent
Chen et al.

(10) Patent No.: US 8,508,041 B2
(45) Date of Patent: Aug. 13, 2013

(54) BONDING METHOD FOR THREE-DIMENSIONAL INTEGRATED CIRCUIT AND THREE-DIMENSIONAL INTEGRATED CIRCUIT THEREOF

(75) Inventors: Kuan-Neng Chen, Hsinchu (TW); Sheng-Yao Hsu, Taichung (TW)

(73) Assignee: National Chiao Tung University, Hsinchu (TW)

( * ) Notice: Subject to any disclaimer, the term of this patent is extended or adjusted under 35 U.S.C. 154(b) by 75 days.

(21) Appl. No.: 13/325,587

(22) Filed: Dec. 14, 2011

(65) Prior Publication Data

US 2013/0069248 A1    Mar. 21, 2013

(30) Foreign Application Priority Data

Sep. 16, 2011  (TW) .............................. 100133482 A

(51) Int. Cl.
*H01L 23/34* (2006.01)

(52) U.S. Cl.
USPC ............ 257/713; 257/431; 257/678; 257/717

(58) Field of Classification Search
USPC ................. 257/431, 678, 687, 713, 717, 720, 257/781, 782, 783, E21.006, E21.077, E21.081, 257/E21.084, E21.088, E21.267, E21.311, 257/E21.321
See application file for complete search history.

(56) References Cited

U.S. PATENT DOCUMENTS

| | | | |
|---|---|---|---|
| 5,334,804 A | 8/1994 | Love et al. | |
| 6,890,829 B2 * | 5/2005 | Cheng et al. | 438/381 |
| 7,239,025 B2 * | 7/2007 | Farrar | 257/779 |
| 7,335,994 B2 * | 2/2008 | Klein et al. | 257/778 |
| 7,497,005 B2 * | 3/2009 | Forbes et al. | 29/602.1 |
| 7,932,590 B2 * | 4/2011 | Lam | 257/686 |

OTHER PUBLICATIONS

Tsukimoto, S. et al. "Effect of Annealing Ambient on the Self-Formation Mechanism of Diffusion Barrier Layers Used in Cu(Ti) Interconnects" *Journal of Electronic Materials*, 2007, 36(3):258-265.

\* cited by examiner

*Primary Examiner* — David Nhu
(74) *Attorney, Agent, or Firm* — Saliwanchik, Lloyd & Eisenschenk

(57) ABSTRACT

The present invention discloses a bonding method for a three-dimensional integrated circuit and the three-dimensional integrated circuit thereof. The bonding method comprises the steps of: providing a substrate; depositing a film layer on the substrate; providing a light source to light onto the film layer to form a graphic structure; forming a metal co-deposition layer by a first metal and a second metal that are co-deposited on the film layer; providing a first integrated circuit having the substrate, the film layer and the metal co-deposition layer sequentially; providing a second integrated circuit that having the metal co-deposition layer, the film layer and the substrate sequentially; and the first integrated circuit is bonded with the second integrated circuit at a predetermined temperature to form a three-dimensional integrated circuit.

9 Claims, 6 Drawing Sheets

BONDING METHOD FOR THREE-DIMENSIONAL INTEGRATED CIRCUIT AND THREE-DIMENSIONAL INTEGRATED CIRCUIT THEREOF

CROSS-REFERENCE TO RELATED APPLICATION

This application claims the benefit under 35 U.S.C. §119 of Taiwan Patent Application No. 100133482, filed Sep. 16, 2011, which is hereby incorporated by reference in its entirety.

BACKGROUND

1. Field of the Invention

The present invention relates to a bonding method for a three-dimensional integrated circuit and the three-dimensional integrated circuit, in particular to the bonding method for a three-dimensional integrated circuit capable of forming an adhesive layer, a barrier layer and a boundary protection layer automatically as well as the three-dimensional integrated circuit thereof.

2. Description of the Related Art

As science and semiconductor technology advance, technical products tend to be developed with a compact, thin, light and multifunctional design. The containing spaces of these products tend to be reduced constantly and more challenging on the design of the integrated circuit (IC). Currently, the development of the present existing technology in stacking three-dimensional integrated circuits, the area of memories installed on a printed circuit board is reduced significantly to improve the efficiency of miniaturizing an electronic product and integrate different functional chips into the same package to enhance the performance and benefit of a system in package (SiP).

In a conventional bonding method of the integrated circuits as disclosed in U.S. Pat. No. 5,334,804, a method of using conductive copper pillars to connect an integrated circuit chip and a substrate, but this method involves a complicated manufacturing process and a high level of difficulties of the manufacture, and this method is more suitable for a back-end packaging process and cannot be applied in a front-end process. The "Effect of Annealing Ambient on the Self-Formation Mechanism of Diffusion Barrier Layers Used in Cu(Ti) Interconnects" as disclosed by S. TSUKIMOTO et. al in 2007 is applicable in copper conducting wires to inhibit the wires from being oxidized easily. However, this method is only applicable for bonding two-dimensional planes, and not applicable for extending the degree of freedom. Obviously, the development of this method is limited.

From the description above, the prior arts have the problems of having a complicated manufacturing process, failing to extend the degree of freedom, fitting in the traditional manufacturing method only, and limiting the development of science and technology. Therefore, it is an urgent issue for related manufacturers or designers to design a bonding method for a three-dimensional integrated circuit and a three-dimensional integrated circuit thereof.

BRIEF SUMMARY

In view of the aforementioned drawbacks of the prior art, it is a primary objective of the present invention to provide a bonding method for a three-dimensional integrated circuit and the three-dimensional integrated circuit thereof to overcome the problems of the prior art that takes too much time, incurs a complicated manufacturing process and fails to extend the degree of freedom.

To achieve the aforementioned objectives, the present invention provides a bonding method for a three-dimensional integrated circuit, which is applicable for manufacturing the three-dimensional integrated circuit, and the bonding method comprises the steps of: providing a first integrated circuit and a second integrated circuit each sequentially having a substrate, a film layer and a metal co-deposition layer, and each of the integrated circuits being formed by the steps of: providing the substrate; depositing the film layer on the substrate; forming a pattern structure by exposing the film layer to a light source through a mask; and superimposing the first integrated circuit onto the second integrated circuit at a predetermined temperature, such that the co-deposition layers thereof are bonded with each other, and at least a portion of atoms of the first metal diffuse toward a bonding interface between the co-deposition layers and at least a portion of atoms of the second metal diffuse toward the respective film layers of each of the integrated circuit to form adhesion and barrier layers for the first metal.

In an embodiment, the adhesion and barrier layers may provide a more stable adhesiveness between the first metal and the film layers, and may inhibit the atoms of the first metal from diffusing into the film layers.

In an embodiment, the predetermined temperature may be between 200° C. and 400° C.

In an embodiment, the superimposing step may be carried out under atmospheric ambient environment.

In an embodiment, at least another portion of the atoms of the second metal at peripheries of the co-deposition layers react with oxygen, and thereby forming a boundary protection layer to protect the first metal from oxidization.

In an embodiment, the first metal can be copper and the second metal can be titanium.

To achieve the aforementioned objectives, the present invention further provides a three-dimensional integrated circuit, the three-dimensional integrated circuit comprises a first integrated circuit and a second integrated circuit. The first integrated comprises a first substrate, a first film layer and a first metal co-deposition layer. The first film layer which is formed on the first structure has a pattern structure. The first metal co-deposition layer which is deposed on the first film layer has a first metal and a second metal deposited. The second integrated comprises a second substrate, a second film layer and a second metal co-deposition layer. The second film layer which is formed on the second structure has a pattern structure. The second metal co-deposition layer which is deposed on the second film layer has a first metal and a second metal deposited. The second integrated circuit is superimposed onto the first integrated circuit at a predetermined temperature, such that the first co-deposition layer and the second co-deposition layer are bonded with each other, and at least a portion of atoms of the first metal diffuse toward a bonding interface between the first co-deposition layer and the second co-deposition layer, and at least a portion of atoms of the second metal diffuse toward the respective film layers of each of the integrated circuits to form adhesion and barrier layers for the first metal.

In an embodiment, the adhesion and barrier layers may provide a more stable adhesiveness between the first metal and the film layers, and may inhibit the atoms of the first metal from diffusing into the film layers.

In an embodiment, the predetermined temperature may be between 200° C. and 400° C.

In an embodiment, the superimposing step may be carried out under atmospheric ambient environment.

In an embodiment, at least another portion of the atoms of the second metal at peripheries of the co-deposition layers react with oxygen, and thereby forming a boundary protection layer to protect the first metal from oxidization.

In an embodiment, the first metal can be copper and the second metal can be titanium.

To achieve the aforementioned objectives, the present invention further provides a three-dimensional integrated circuit, the three-dimensional integrated circuit comprises a first integrated circuit and a second integrated circuit. The first integrated circuit sequentially having a first substrate, a first film layer and a first metal co-deposition layer. The second integrated circuit having a second metal co-deposition layer, a second film layer and a second substrate sequentially. The first metal co-deposition layer and the second metal co-deposition layer are bonded with each other at a predetermined temperature, and an adhesion and barrier layer is formed near the first film layer or the second film layer, and a boundary protection layer is formed near a surface of the first metal co-deposition layer or the second metal co-deposition layer.

In an embodiment, the first metal co-deposition layer and the second metal co-deposition layer may be bonded with each other under atmospheric ambient environment at the predetermined temperature.

In an embodiment, the first metal co-deposition layer and the second metal co-deposition layer may be bonded with each other in a cavity at the predetermined temperature.

In summation, the bonding method for a three-dimensional integrated circuit and the three-dimensional integrated circuit in accordance with the present invention can overcome the problems of the prior art having a complicated manufacturing process, failing to extend the degree of freedom, and limiting the development of science and technology. The bonding method for a three-dimensional integrated circuit and the three-dimensional integrated circuit of the present invention can be applied in a high-temperature manufacturing process for bonding copper and titanium under atmospheric ambient environment, and automatically forming a titanium adhesive layer, a barrier layer and a boundary protection layer made of titanium oxide for resisting the oxidization of copper. The present invention further simplifies the manufacturing procedure to form the copper titanium co-deposition structure directly without increasing additional sputter depositions of a titanium adhesive layer, a copper seed layer or a mass copper layer.

The aforementioned and other objectives of the present invention will become apparent with the detailed description of preferred embodiment and the illustration of related drawings as follows.

DETAILED DESCRIPTION

The technical characteristics of the present invention become apparent with the detailed description of preferred embodiments and the illustration of related drawings as follows. It is noteworthy to point out that the preferred embodiments are provided for the purpose of illustrating the invention only, but not intended for limiting the scope of the invention, and the same numerals are used in the following preferred embodiments to represent respective elements.

Figure 1:
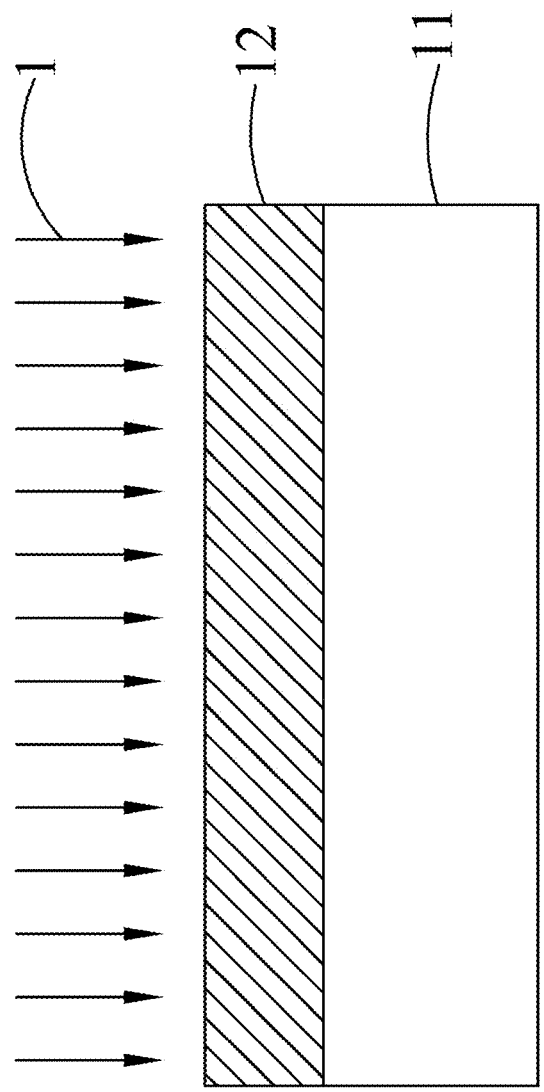
FIG. 1 is a first schematic view of a three-dimensional integrated circuit in accordance with a first preferred embodiment of the present invention.

With reference to FIGS. 1 to 4 for first, second, third and fourth schematic views of a three-dimensional integrated circuit in accordance with the first preferred embodiment of the present invention respectively, a first substrate 11 and a second substrate 21 of this preferred embodiment can be silicon wafers of any dimensions or specifications. The first film layer 12 or the second film layer 22 can be made of silicon dioxide or any other film material. The first metal and the second metal can be any metal, and the first metal of this preferred embodiment can be copper, and the second metal of this preferred embodiment can be titanium, but the invention is not limited to these metals only. In FIGS. 1 to 4, the first integrated circuit 10 may have a first substrate 11, a first film layer 12 and a first metal co-deposition layer 13 sequentially. In FIG. 1, the first film layer 12 can be set on the first substrate 11 and made of a material with a thickness that can be changed according to different requirements. In this preferred embodiment, silicon dioxide with a thickness of 1000 nm is preferably deposited on the first substrate 11 and can be used as the first film layer 12. A light source 1 may be provided to light onto the first film layer 12 to form a graphic structure through a photomask.

Figure 2:
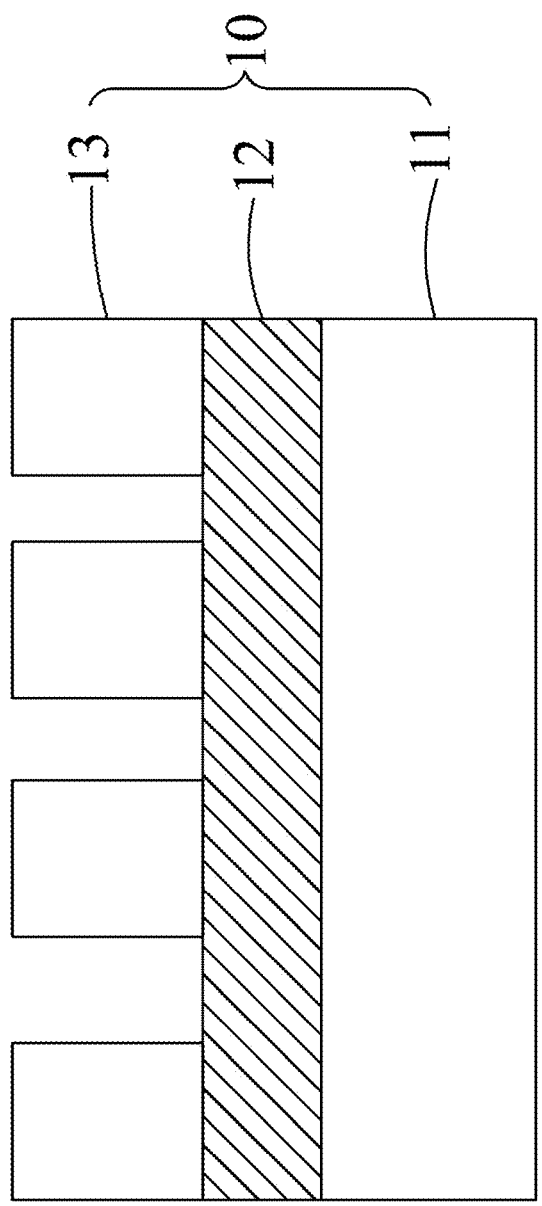
FIG. 2 is a second schematic view of a three-dimensional integrated circuit in accordance with the first preferred embodiment of the present invention.

In FIG. 2, a physical vapor deposition method may be applied for depositing a first metal and a second metal onto the first film layer 12 to form the first metal co-deposition layer 13. In this preferred embodiment, the first metal can be copper and the second metal can be titanium, but the invention is not limited to such arrangements only, and the first metal co-deposition layer 13 can be a copper titanium co-deposition structure to form the first integrated circuit 10.

It is noteworthy to point out that a physical vapor deposition method may be a method of using a high-temperature heat source to heat a raw material to a high temperature and vaporize the raw material to form plasma and then condensing the plasma on the substrate to form materials in different states such as single crystal, thin film or crystal grain.

Figure 3:
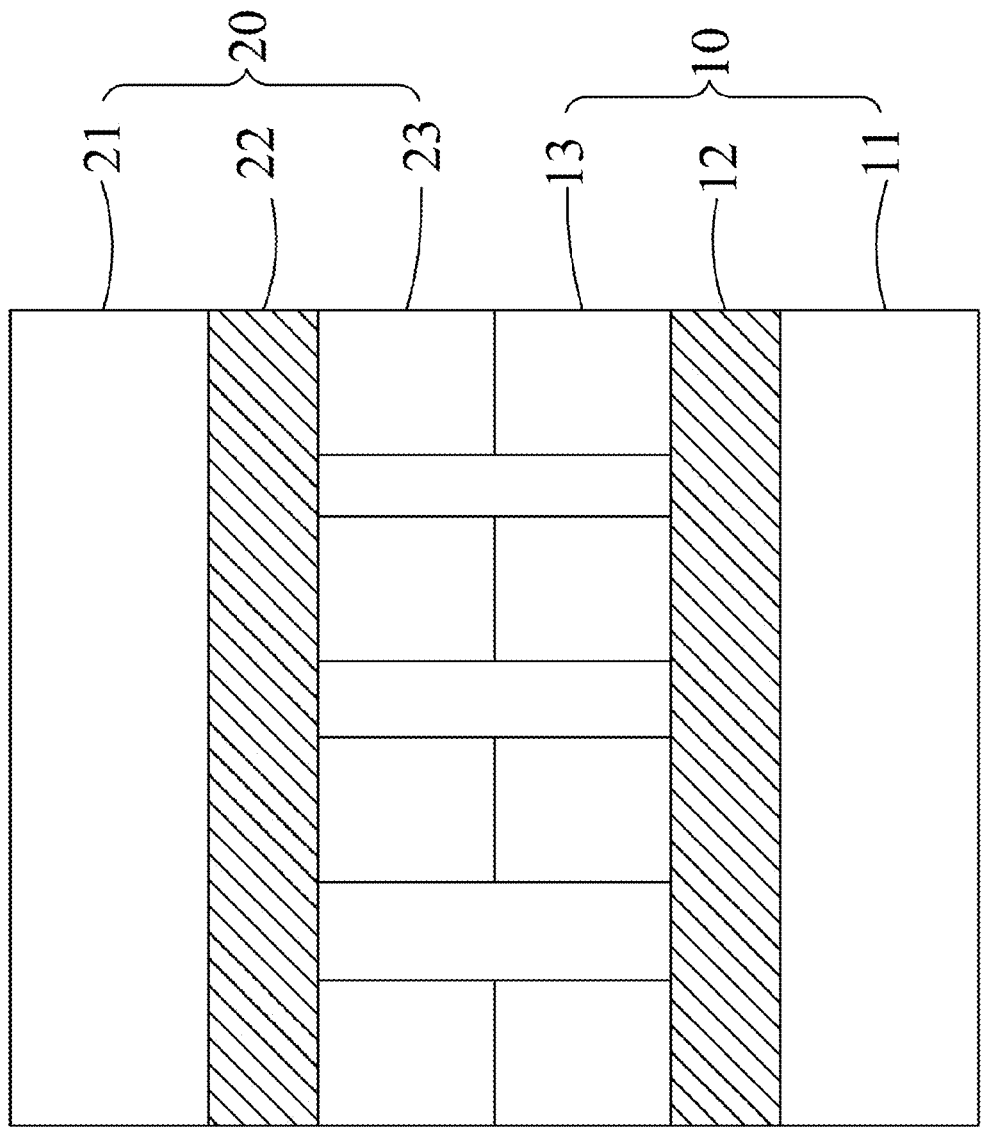
FIG. 3 is a third schematic view of a three-dimensional integrated circuit in accordance with the first preferred embodiment of the present invention.
Figure 4:
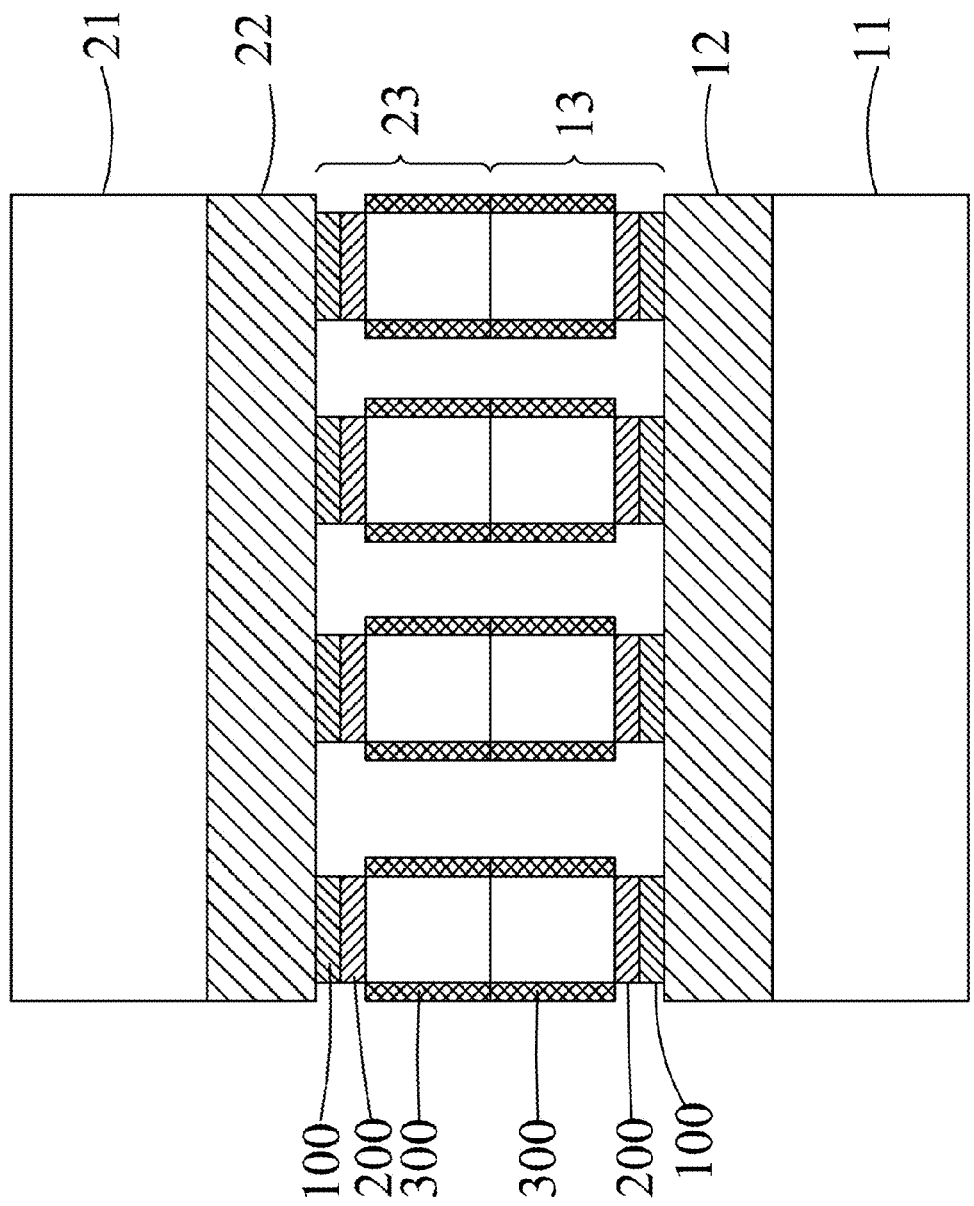
FIG. 4 is a fourth schematic view of a three-dimensional integrated circuit in accordance with the first preferred embodiment of the present invention.

In FIGS. 2 to 4, the second integrated circuit 20 may have a second metal co-deposition layer 23, a second film layer 22 and a second substrate 21 sequentially, and the second integrated circuit 20 can be superimposed onto the first integrated circuit 10 at a predetermined temperature. It is noteworthy to point out that the first metal co-deposition 13 of the first integrated circuit 10 and the second metal co-deposition 14 of the second integrated circuit 20 are bonded with each other on the contact surface by high temperature process. The predetermined temperature preferably may fall within a range from 200° C. to 400° C. In the figures, the first integrated circuit 10 and the second integrated circuit 20 can be bonded to form a three-dimensional integrated circuit. It is noteworthy to point out that the first integrated circuit 10 and the second integrated circuit 20 are stacked and bonded with each other in this preferred embodiment, but the invention is not limited to two stacked layers. The number of layers and the metal may be used for the manufacture that can be changed freely according to the manufacturing conditions.

It is noteworthy to point out that the first integrated circuit 10 and the second integrated circuit 20 can be bonded preferably at the predetermined temperature from 200 to 400° C., and an adhesive layer 100 or a barrier layer 200 may be formed near the first film layer 12 and the second film layer 22. In this preferred embodiment, the first metal co-deposition layer 13 and the second metal co-deposition layer 23 can be a copper titanium co-deposition structure, so that when the first integrated circuit 10 and the second integrated circuit 20 are bonded at the predetermined temperature from 200° C. to 400° C., copper atoms will diffuse and move toward the interface, and titanium atoms will move toward the substrate made of silicon dioxide, and a titanium adhesive layer 100 is formed on a surface of the substrate made of silicon dioxide, so as to inhibit copper atoms from diffused into the barrier layer 200 made of silicon dioxide.

At the same time, the temperature may be preferably set to a range from 200° C. to 400° C. under atmospheric ambient environment, or a small amount of oxygen is passed into a cavity for bonding the first integrated circuit 10 and the second integrated circuit 20, and forming a boundary protection layer 300 near a surface of the first metal co-deposition layer 13 and the second metal co-deposition layer 2. In this preferred embodiment, titanium tends to be combined with the oxygen in the air to form titanium oxide, so that part of the titanium will move towards the boundary. In addition, titanium oxide has a very high density, so that once if titanium oxide is formed, oxygen will be unable to diffuse into the copper titanium co-deposition structure. In other words, the diffusion effect can further inhibit copper from being oxidized.

It is noteworthy to point out that persons ordinarily skilled in the art should be able to understand that the materials and implementation for each stack layer as described above are provided for the purpose of illustrating the present invention only, but not intended for limiting the scope of the invention.

Based on the first preferred embodiment, the present invention further provides a second preferred embodiment for illustrating the invention as follows.

Figure 5:
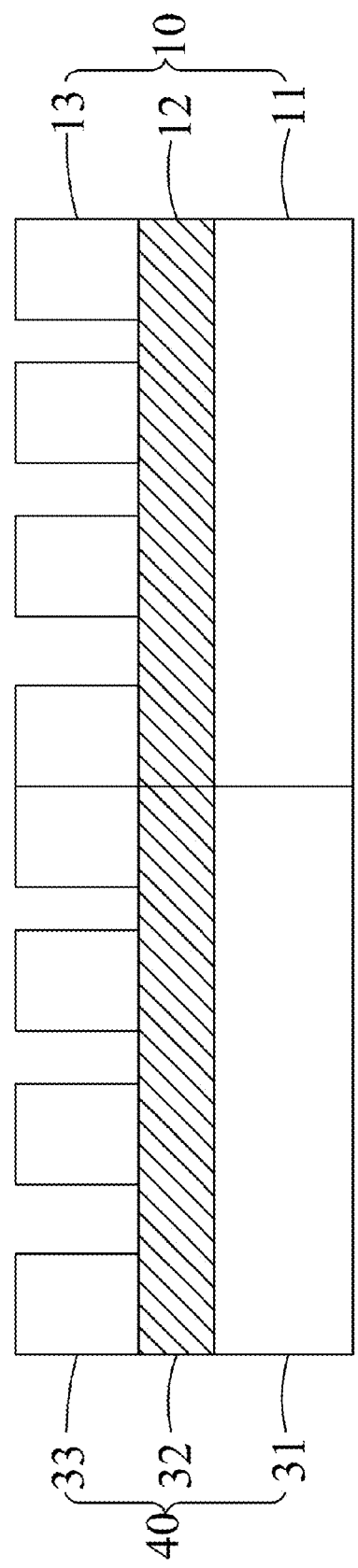
FIG. 5 is a schematic view of a three-dimensional integrated circuit in accordance with a second preferred embodiment of the present invention.

With reference to FIG. 5 for a schematic view of a three-dimensional integrated circuit in accordance with the second preferred embodiment of the present invention, the first substrate 11 and the third substrate 31 of this preferred embodiment can be silicon wafers with a size or a specification not limited specifically. The first film layer 12 or third film layer 32 is made of silicon dioxide or any other film material. The first metal and the second metal can be any metal, and the first metal of this preferred embodiment can be copper, and the second metal of this preferred embodiment can be titanium, but the invention is not limited to such arrangements only.

In FIG. 5, the first integrated circuit may have a first substrate 11, a first film layer 12 and a first metal co-deposition layer 13 sequentially. The first film layer 12 can be set on the first substrate 11, and the thickness or material of the first film layer 12 can be changed as needed. In this preferred embodiment, it is preferably to deposit 1000 nm of silicon dioxide on the first substrate 11 as the first film layer 12. Providing a light source to light onto the first film layer 12 to form a graphic structure through a photomask.

The physical vapor deposition method can be applied to deposit the first metal and second metal onto the first film layer 12 to form the first metal co-deposition layer 13. The first metal of this preferred embodiment can be copper, and the second metal of this preferred embodiment may be titanium, but the invention is not limited to such arrangements only. The first metal co-deposition layer 13 can be a copper titanium co-deposition structure and used for forming the first integrated circuit 10. At the same time, the third integrated circuit 40 can be manufactured by the same stacking and manufacturing method of the first integrated circuit 10, and the third integrated circuit 40 may have a third substrate 31, a third film layer 32 and a third metal co-deposition layer 33 sequentially. The first integrated circuit 10 can be attached on a side of the third integrated circuit 40 at a predetermined temperature, and the temperature preferably falls within a range from 200° C. to 400° C. In this preferred embodiment as shown in FIG. 5, the first integrated circuit 10 and the third integrated circuit 40 are attached and bonded side by side with each other, but the invention is not limited to such arranged positions only.

Even though the concept of the bonding method for a three-dimensional integrated circuit has been described in the section of the three-dimensional integrated circuit of the present invention already, a flow chart is provided for describing the method as follows.

Figure 6:
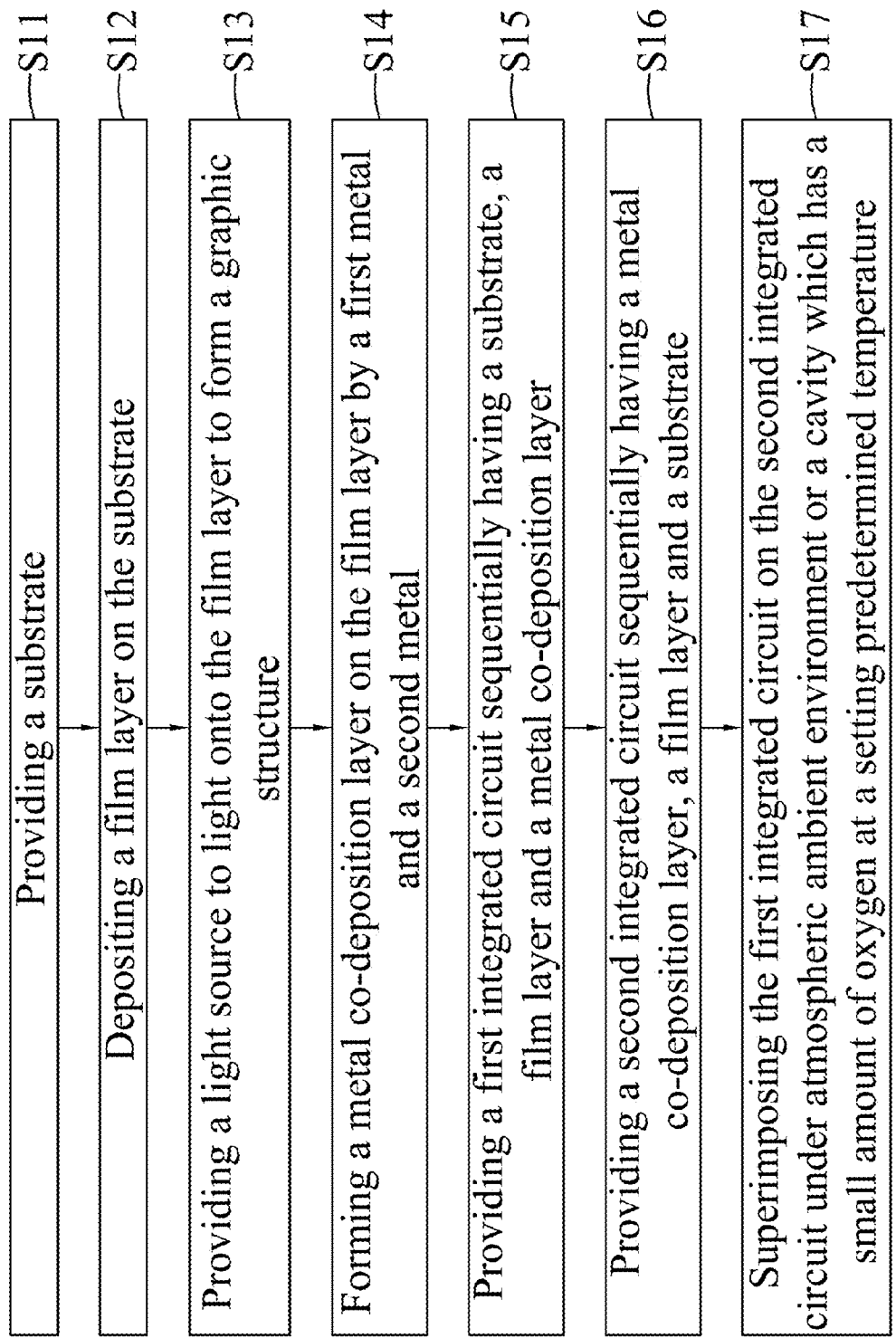
FIG. 6 is a flow chart of a bonding method for a three-dimensional integrated circuit in accordance with the present invention.

With reference to FIG. 6 for the flow chart of the bonding method for a three-dimensional integrated circuit of the present invention, the bonding method is applicable for manufacturing a three-dimensional integrated circuit, and the three-dimensional integrated circuit comprises a first integrated circuit and a second integrated circuit. The first integrated circuit may have a first substrate, a first film layer and a first metal co-deposition layer sequentially, and the second integrated circuit may have a second metal co-deposition layer, a second film layer and a second substrate sequentially. The bonding method for a three-dimensional integrated circuit comprising the following steps:

Step S11: Providing a substrate.

Step S12: Depositing a film layer on the substrate.

Step S13: Providing a light source to light onto the film layer to form a graphic structure.

Step S14: Forming a metal co-deposition layer on the film layer by a first metal and a second metal.

Step S15: Providing a first integrated circuit sequentially having a substrate, a film layer and a metal co-deposition layer.

Step S16: Providing a second integrated circuit sequentially having a metal co-deposition layer, a film layer and a substrate.

Step S17: Superimposing the first integrated circuit on the second integrated circuit under atmospheric ambient environment or a cavity which has a small amount of oxygen at a predetermined temperature.

The detailed description and implementation of the bonding method for a three-dimensional integrated circuit in accordance with the present invention have been described in the sections above, and thus will not be described again.

In summation of the description above, the bonding method for a three-dimensional integrated circuit and the three-dimensional integrated circuit in accordance with the present invention have one or more of the following advantages:

(1) The present invention can overcome the problems of the prior art having a complicated manufacturing process, failing to extend the degree of freedom, and limiting the development of science and technology.

(2) The bonding method for a three-dimensional integrated circuit and the three-dimensional integrated circuit in accordance with the present invention can be applied in the high-temperature manufacturing process for bonding copper and titanium under atmospheric ambient environment and automatically forming a titanium adhesive layer, a barrier layer and a boundary protection layer made of titanium oxide for resisting the oxidization of copper.

(3) The bonding method for a three-dimensional integrated circuit and the three-dimensional integrated circuit in accordance with the present invention can simplify the manufacturing flow and form a copper titanium co-deposition structure directly without increasing an additional sputter deposition of a titanium adhesive layer, a copper seed layer or a mass copper layer.

While the invention has been described by means of specific embodiments, numerous modifications and variations could be made thereto by those skilled in the art without departing from the scope and spirit of the invention set forth in the claims.

What is claimed is:

1. A three-dimensional integrated circuit, comprising:
   a first integrated circuit, comprising:
   a first substrate;
   a first film layer, formed on the first substrate, having a first pattern structure formed thereon; and
   a first metal co-deposition layer disposed on the first film layer, having a first metal and a second metal deposited therewithin; and
   a second integrated circuit, comprising:
   a second substrate;
   a second film layer, formed on the second substrate, having a second pattern structure formed thereon; and
   a second metal co-deposition layer disposed on the second film layer, having the first metal and the second metal deposited therewithin;
   wherein the second integrated circuit is superimposed onto the first integrated circuit at a predetermined temperature, such that the first metal co-deposition layer and the second metal co-deposition layer are bonded with each other, and at least a portion of atoms of the first metal diffuse toward a bonding interface between the first metal co-deposition layer and the second metal co-deposition layer, and at least a portion of atoms of the second metal diffuse toward the respective film layers of each of the integrated circuits to form adhesion and barrier layers for the first metal.

2. The three-dimensional integrated circuit of claim 1, wherein the adhesion and barrier layers provides a more stable adhesiveness between the first metal and the film layers, and inhibits the atoms of the first metal from diffusing into the film layers.

3. The three-dimensional integrated circuit of claim 1, wherein the predetermined temperature is between 200° C. and 400° C.

4. The three-dimensional integrated circuit of claim 1, wherein the superimposing step is carried out under atmospheric ambient environment.

5. The three-dimensional integrated circuit of claim 1, wherein at least another portion of the atoms of the second metal at peripheries of the co-deposition layers react with oxygen, and thereby forming a boundary protection layer to protect the first metal from oxidization.

6. The three-dimensional integrated circuit of claim 5, wherein the first metal is copper and the second metal is titanium.

7. A three-dimensional integrated circuit, comprising:
   a first integrated circuit, having a first substrate, a first film layer and a first metal co-deposition layer sequentially; and
   a second integrated circuit, having a second metal co-deposition layer, a second film layer and a second substrate sequentially;
   wherein, the first metal co-deposition layer and the second metal co-deposition layer are bonded with each other at a predetermined temperature, and an adhesion and barrier layer is formed near the first film layer or the second film layer, and a boundary protection layer is formed near a surface of the first metal co-deposition layer or the second metal co-deposition layer.

8. The three-dimensional integrated circuit of claim 7, wherein the first metal co-deposition layer and the second metal co-deposition layer are bonded with each other at the predetermined temperature and under atmospheric ambient environment.

9. The three-dimensional integrated circuit of claim 7, wherein the first metal co-deposition layer and the second metal co-deposition layer are bonded with each other in a cavity at the predetermined temperature.

* * * * *